United States Patent
Naik et al.

(10) Patent No.: US 12,032,041 B2
(45) Date of Patent: Jul. 9, 2024

(54) MAGNETIC FIELD SENSOR

(71) Applicant: GLOBALFOUNDRIES Singapore Pte. Ltd., Singapore (SG)

(72) Inventors: Vinayak Bharat Naik, Singapore (SG); Hemant M. Dixit, Halfmoon, NY (US); Kazutaka Yamane, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/697,396

(22) Filed: Mar. 17, 2022

(65) Prior Publication Data

US 2023/0296698 A1 Sep. 21, 2023

(51) Int. Cl.
*G01R 33/00* (2006.01)
*G01R 33/07* (2006.01)
*G01R 33/09* (2006.01)

(52) U.S. Cl.
CPC .......... *G01R 33/0047* (2013.01); *G01R 33/07* (2013.01); *G01R 33/093* (2013.01); *G01R 33/096* (2013.01); *G01R 33/098* (2013.01)

(58) Field of Classification Search
CPC .. G01R 33/0047; G01R 33/07; G01R 33/093; G01R 33/096; G01R 33/098
See application file for complete search history.

(56) References Cited

U.S. PATENT DOCUMENTS

| | | | |
|---|---|---|---|
| 9,116,198 B2 | 8/2015 | Cai et al. | |
| 2007/0121249 A1* | 5/2007 | Parker | H10B 61/00 360/123.1 |
| 2011/0074406 A1* | 3/2011 | Mather | B82Y 25/00 324/252 |
| 2018/0059148 A1* | 3/2018 | Geisler | G01R 15/202 |
| 2018/0062071 A1* | 3/2018 | Bolognia | G01R 33/091 |

OTHER PUBLICATIONS

Phan et al., "Geometry Optimization of TMR Current Sensors for On-Chip IC Testing", IEEE Transactions on Magnetics, Oct. 2005, vol. 41, Issue 10, Abstract, 2 pages.
Ferreira et al., "2-Axis Magnetometers Based on Full Wheatstone Bridges Incorporating Magnetic Tunnel Junctions Connected in Series", IEEE Transactions on Magnetics, Nov. 2012, vol. 48, Issue 11, 4 pages.
Unknown, "TMR for 2D Angle Sensing", Crocus Technology, Document #: AN119—TMR for 2D Angle Sensing Rev0.8, 2021, 5 pages.

* cited by examiner

*Primary Examiner* — Alvaro E Fortich
(74) *Attorney, Agent, or Firm* — Andrew M. Calderon; Calderon Safran & Wright, PC

(57) ABSTRACT

The present disclosure relates to sensors and, more particularly, to magnetic field sensors. More specifically, a structure includes a package with a wraparound geometry and discontinuous ends, and includes a low permeability magnetic material.

18 Claims, 2 Drawing Sheets

MAGNETIC FIELD SENSOR

BACKGROUND

The present disclosure relates to sensors and, more particularly, to magnetic field sensors.

Magnetic field sensors are useful in many applications. For example, magnetic field sensors can be tailored to automotive applications such as anti-lock braking systems or other monitoring systems. In use, for example, the magnetic field sensors detect changes and disturbances in a magnetic field like flux, strength and direction. The magnetic sensor converts the magnitude and variations of the magnetic field into electric signals. These electrical signals can then be used for the many different applications.

Magnetic field sensors, though, are unable to sense magnetic flux from all three orthogonal axes. For example, conventional magneto-resistive (MR) sensors, such as AMR (anisotropic MR) sensors, GMR (giant MR) sensors, TGMR (tunneling GMR) sensors, etc., detect magnetic flux that is parallel to the device plane but cannot detect flux that is perpendicular to the device plane. On the other hand, Hall-effect sensors can sense magnetic flux that is perpendicular to the device plane, i.e., along the Z axis, but cannot sense magnetic flux parallel to the device plane, i.e., in the XY plane.

SUMMARY

In an aspect of the disclosure, a structure comprises a package with a wraparound geometry and discontinuous ends, and comprising a low permeability magnetic material.

In an aspect of the disclosure, a structure comprises: a first section; a second section comprising legs orthogonal to the first section and extending from opposing ends of the first section; a third section comprising legs parallel to the first section; and a space between the legs of the third section.

In an aspect of the disclosure, a structure comprises: a first sensor sensing a magnetic field in a first plane and a second plane; a magnetic field conversion structure with discontinuous ends, and which is structured to absorb a magnetic field and release the magnetic field in a third plane, converted from one of the second plane and the first plane; and a second sensor between the discontinuous ends and which senses the magnetic field in the third plane.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to sensors and, more particularly, to magnetic field sensors. More specifically, the present disclosure relates to a structure which converts a magnetic field from one plane, e.g., X-axis, into a second plane, e.g., Z-axis. In this way, a two-dimensional sensor may sense a magnetic field originating in a third dimensional. Advantageously, the present disclosure achieves 3D magnetic sensing without introducing complex designs and process complexity.

In embodiments, the present disclosure provides a magnetic field conversion structure (e.g., package) which can be used with magnetic field sensors. In embodiments, the magnetic field sensors used with the magnetic field conversion structure can sense 3D magnetic fields or magnetic fields in a plane which it was not originally designed to sense. For example, by using the field converter structure an X-Y magnetic field sensor can sense a magnetic field in a Z plane. The magnetic field conversion structure can be used with a host of different types of magnetic sensors including, but not limited to, a Hall effect sensor, MR sensor, AMR sensor, GMR sensor, TGMR sensor and TMR sensor, amongst others.

Figure 1:
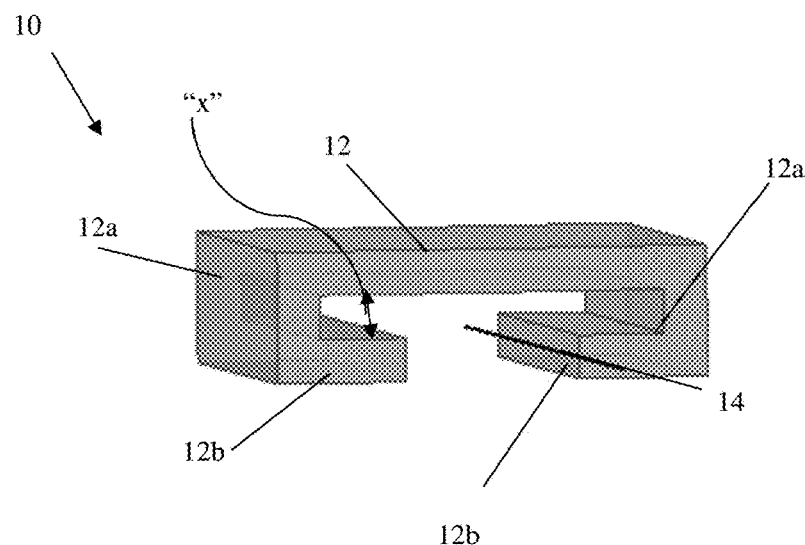
FIG. 1 shows a magnetic field conversion structure (e.g., package) in accordance with aspects of the present disclosure.

FIG. 1 shows a magnetic field conversion structure in accordance with aspects of the present disclosure. The magnetic field conversion structure (e.g., package) 10 may be composed of permeability magnetic material and, more preferably, low permeability magnetic material. In embodiments, the low permeability magnetic material provides the field conversion structure 10 with the ability to form an internal magnetic field within itself under the influence of an applied magnetic field. In this way, a magnetic field can travel within the material, e.g., magnetic field conversion structure 10, and change planes from an X or Y plane to a Z plane or any variation thereof, e.g., Z plane to X or Y plane.

In specific applications, the materials of the magnetic field conversion structure 10 should be selected based on a saturation rate of a particular magnetic field. For example, the low permeability magnetic material may include ferromagnetic materials or ferrimagnetic materials. By way of non-limiting, illustrative examples, the magnetic field conversion structure 10 may be composed of aluminum, stainless steel, carbon steel, nickel, ferrite, Neodymium or platinum or combinations thereof.

Still referring to FIG. 1, the magnetic field conversion structure 10 includes a wraparound geometry comprising several sections 12, 12a and 12b. By way of illustration, the magnetic field conversion structure 10 includes a main section 12, with two sections 12a extending or oriented orthogonal (perpendicular) from the main section 12. The magnetic field conversion structure 10 further includes two sections (e.g., opposing legs) 12b extending or oriented orthogonal (perpendicular) to each of the sections 12a. In embodiments, the two sections 12b and the main section 12 may be parallel to one another, with a space 14 provided between the ends of the sections 12b. The two sections (e.g., opposing legs) 12b may also be in the same plane, ends of which face one another forming a discontinuity. This discontinuity is designed to release the magnetic field within the space 14, which accommodates a magnetic field sensor.

In addition, a distance "x" separates each of the sections 12b from the main section 12. In practice, the distance "x" is designed and structured to ensure that a magnetic field traveling with the material of the magnetic field conversion structure 10 does not travel or jump from the main section 12 to any of the sections 12b through the space of distance "x". The distance "x" may be tunable depending on the anticipated strength of the magnetic field. For example, a stronger magnetic field would require a greater distance "x"; whereas a weaker magnetic field would require a smaller distance "x". In one embodiment, the distance "x" may be equal to the length of the sections 12a.

By way of example, distance "x" may be a vertical gap of 1 mm with a magnetic field ranging from about 200 Oe to 100 Oe. Also, although not to be considered a limiting feature, the magnetic field conversion structure 10 may be 3 mm by 3 mm with a shield thickness of about 500 μm, but these dimensions can be tuned based on the size of sensor and/or the anticipated magnetic field and/or materials used for the magnetic field conversion structure 10. Moreover, the length of section 12 may be about 4 mm, the space 14 may be about 4 mm and the width of each side, e.g., length of sections 12a may be about 1 mm, again being tunable based on the size of sensor and/or the anticipated magnetic field and/or materials used for the magnetic field conversion structure 10.

Figure 2:
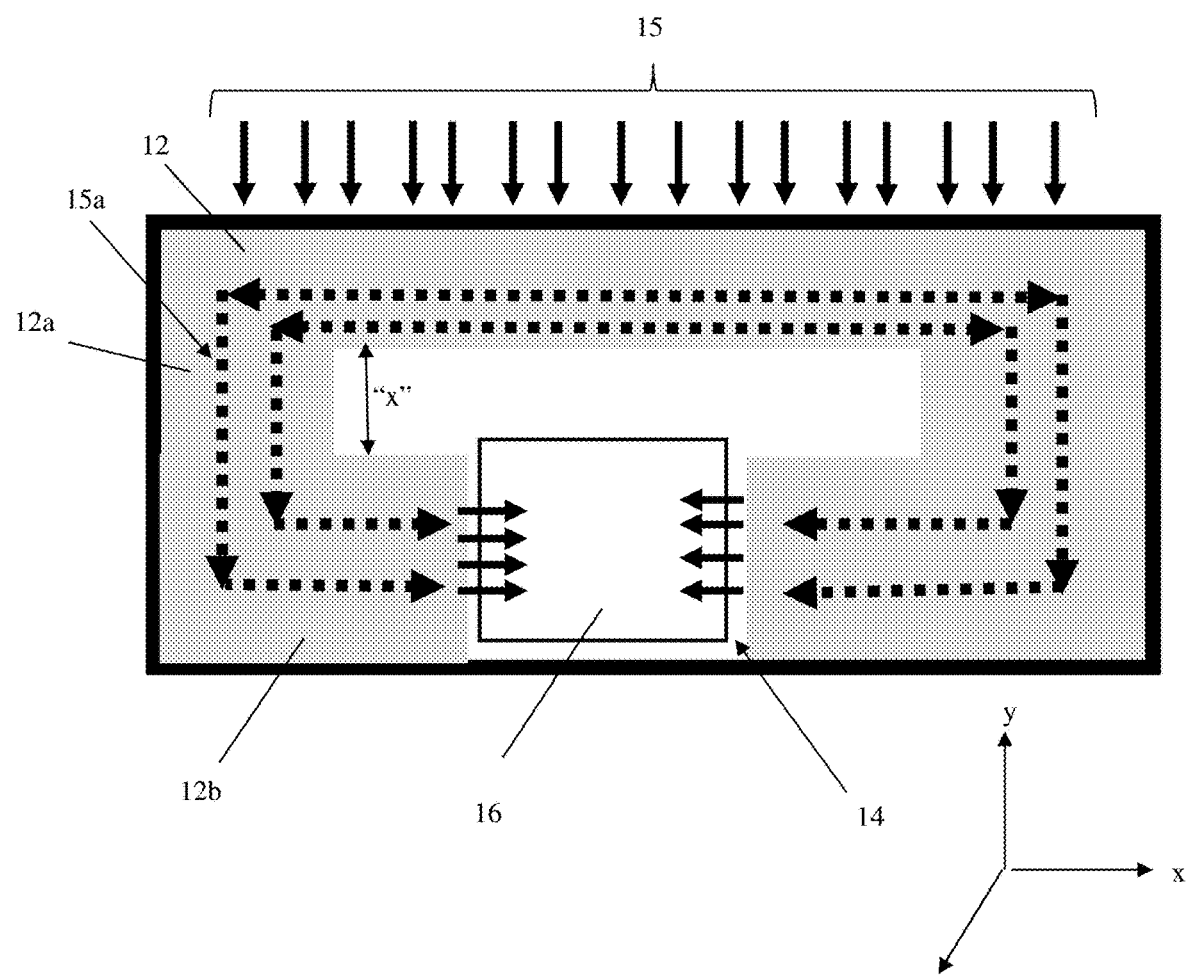
FIG. 2 shows the magnetic field conversion structure with a sensor in accordance with aspects of the present disclosure.

FIG. 2 shows the magnetic field conversion structure 10 with a sensor 16 accommodated within the space 14. In more specific embodiments, the magnetic field conversion structure 10 may have a wraparound geometry with the magnetic sensor 16 in between the shielding ends, e.g., between sections 12b. Preferably, the magnetic sensor 16 is not within the magnetic field conversion structure 10, e.g., between the sections 12 and 12b. In an exemplary embodiment, the magnetic field conversion structure 10 can achieve a conversion efficiency of approximately 75% or greater for the conversion of a magnetic field, for example from a perpendicular to an in-plane direction. The conversion efficiency is dependent on the material choice and dimensions of the structure 10 and may be tuned accordingly to the requirements of the magnetic shielding capability as needed. In some embodiments, the magnetic field conversion structure 10 may be capable of converting very high external magnetic fields of over 1000 Oe.

In embodiments, the sensor 16 may be any type of magnetic sensor, i.e., one-dimensional magnetic sensor or two-dimensional magnetic sensor. For example, the magnetic sensor 16 may be a Hall-effect sensor, MR sensor, AMR sensor, GMR sensor, TGMR sensor or TMR sensor.

As representatively shown in FIG. 2, the magnetic field conversion structure 10 may be subjected to a magnetic field in a first plane, e.g., Z plane, as represented by arrows 15. The magnetic field 15 is absorbed into the low permeability magnetic material of the magnetic field conversion structure 10, and more particularly initially within the section 12. The magnetic field travelling within the sections 12, 12a, 12b of the magnetic field conversion structure 10 is represented by arrows 15a.

In section 12, the magnetic field 15a travels along the length of section 12. The magnetic field 15a continues into sections 12a, changing direction compared to the direction of travel in section 12. Finally, the magnetic field 15a travels in sections 12b exiting the magnetic field conversion structure 10 in a plane different, e.g., X plane, compared to the original plane of the magnetic field 15. The magnetic field 15a will be released from the magnetic field conversion structure 10 at the point of discontinuity, e.g., within space 14, at which stage the magnetic sensor 16 may sense the magnetic field in the new plane. For example, the magnetic field will be redirected from the Z plane into an X or Y plane for sensing by magnetic sensor 16. As it is known that the magnetic field has been redirected into a different plane, it is now possible to sense the Z plane magnetic field.

Figure 3:
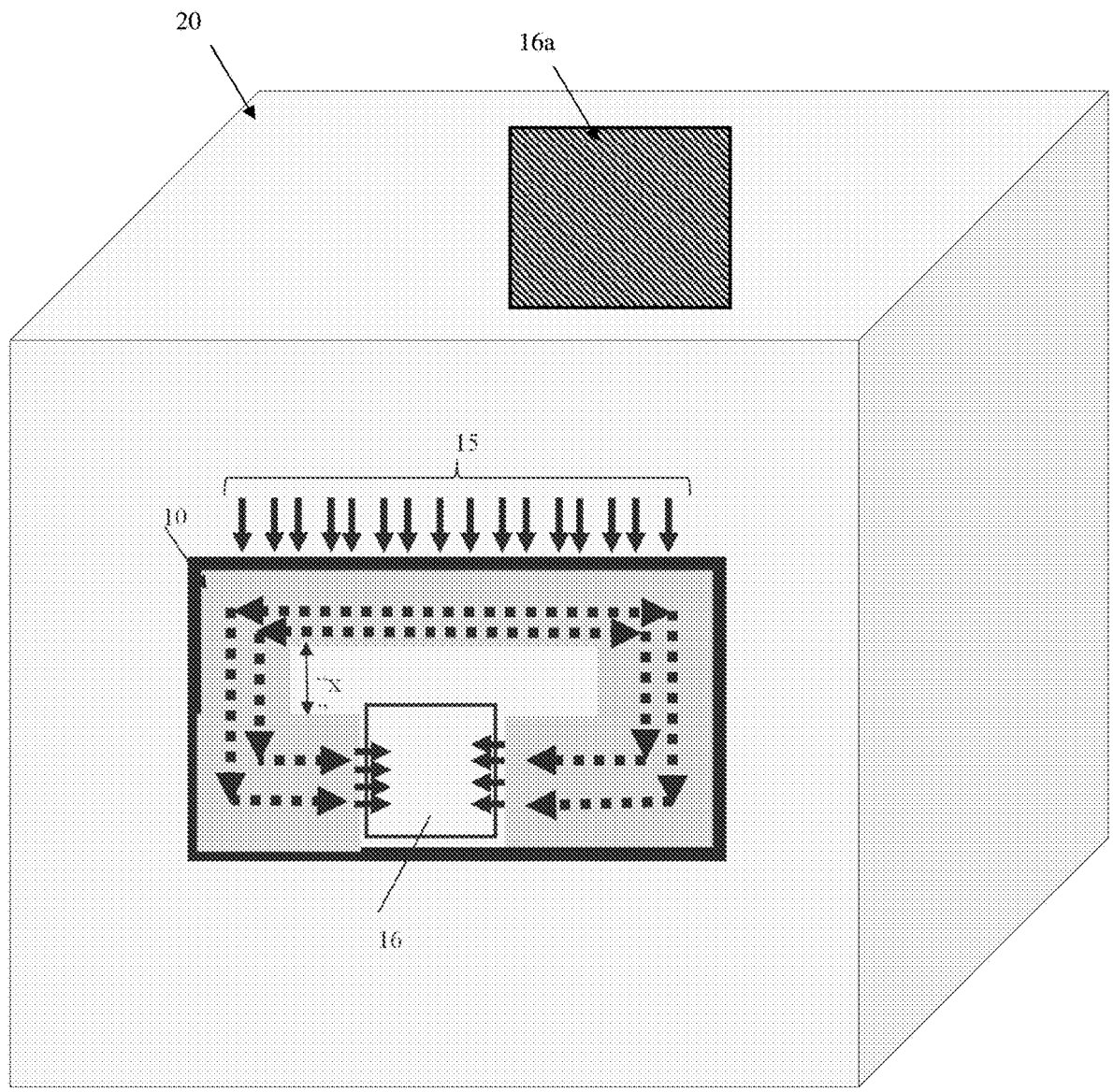
FIG. 3 shows a sensor package in accordance with aspects of the present disclosure.

FIG. 3 shows a sensor package in accordance with aspects of the present disclosure. More specifically, the sensor package 20 includes the magnetic field conversion structure 10 with the sensor 16 within the space 14, in addition to a standalone magnetic sensor 16a. In embodiments, both the sensor 16 and the standalone magnetic sensor 16a may be XY sensors; although other sensors can be used in this package assembly. In this implementation, the standalone magnetic sensor 16a can sense a magnetic field in the XY plane; whereas the sensor 16 can sense the magnetic field in the Z plane. Accordingly, in this configuration, the sensor package 20 can be used to sense a magnetic field in three dimensions, e.g., XYZ planes.

Depending on the orientation of the sensors, the standalone magnetic sensor 16 can sense a magnetic field in the YZ plane and the sensor 16 can sense the magnetic field in the X plane or any combinations thereof. In addition, depending on the specific application, the sensors 16, 16a can be a one-dimensional sensor, each of which senses in a different plane due to the use of the magnetic field conversion structure 10.

The magnetic sensor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a sensor package with a wraparound geometric structure comprising a main section with two sections oriented orthogonal from the main section and further consisting of two opposing legs in a same plane and which consist of a same dimension, and further oriented orthogonal to each of the two sections, the opposing legs each consisting of a single discontinuous end which are parallel to one another and which consist of a single uniform space between the opposing legs, the wraparound geometric structure further comprising a low permeability magnetic material, a magnetic sensor within the uniform space between the discontinuous ends and not extending within an interior portion of the wraparound geometric structure defined between the main section, the two sections and the opposing legs, the magnetic sensor senses a magnetic field in a first plane which is different than an original plane of the magnetic field, and a standalone magnetic sensor which senses the magnetic field in a second plane and a third plane such that the magnetic field is measured in three dimensions, and wherein a distance which separates the main section and the opposing legs is such that a magnetic field traveling with the low permeability magnetic material does not travel or jump from the main section to any of the two sections or the opposing legs through a space defined by the distance.

2. The structure of claim 1, wherein the wraparound geometry is structured to convert a magnetic field from the second plane to a magnetic field in a first plane.

3. The structure of claim 1, wherein the main section is a first section, the opposing legs are a second section and the two sections are a third section, wherein the the first section is parallel to the second section and the third section is orthogonal to the first section and the second section.

4. The structure of claim 3, wherein the space is between legs of the second section.

5. The structure of claim 3 wherein the distance is a length of the third section.

6. The structure of claim 1, wherein the low permeability magnetic material comprises ferromagnetic material.

7. The structure of claim 1, wherein the low permeability magnetic material comprises ferrimagnetic material.

8. The structure of claim 1, wherein the magnetic sensor is a two-dimensional sensor within the space between the discontinuous ends.

9. A structure comprising:
   a first section;
   a second section comprising legs orthogonal to the first section and extending from opposing ends of the first section;
   a third section consisting of two legs parallel to the first section, the two parallel legs in a same plane and consist of a same dimension;
   a single space consisting of a unform distance between the legs of the third section;
   a magnetic field sensor within the single space between the legs of the third section which senses a magnetic field in a first plane which is different than an original plane of the magnetic field, the magnetic field sensor not extending within an interior portion of the wraparound geometric structure defined between the first section, the second section and the legs; and
   a standalone magnetic sensor which senses the magnetic field in a second plane and a third plane such that the magnetic field is measured in three dimensions,
   wherein the first, second, and third sections comprise a sensor package with a wraparound geometric structure comprising discontinuous ends and a low permeability magnetic material, and
   wherein a distance which separates the first section and the legs is such that a magnetic field traveling with the low permeability magnetic material does not travel or jump from the first section to any of the second section or the legs through a space defined by the distance.

10. The structure of claim 9, wherein the low permeability magnetic material comprises ferromagnetic material.

11. The structure of claim 9, wherein the low permeability magnetic material comprises ferrimagnetic material.

12. The structure of claim 9, wherein the first section and the third section are separated by a distance "x".

13. The structure of claim 12, wherein the distance "x" is a length of the second section.

14. A structure comprising:
   a first sensor sensing a magnetic field in a first plane and a second plane;
   a magnetic field conversion structure comprising a sensor package with wraparound geometric structure comprising a main section with two sections oriented orthogonal from the main section and further consisting of two opposing legs in a same plane and which consist of a same dimension, and further oriented orthogonal to each of the two sections, the opposing legs each consisting of a single discontinuous end which are parallel to one another and which consist of a single uniform space between the opposing legs, the wraparound geometric structure further comprising a low permeability magnetic material, and which is structured to absorb a magnetic field and release the magnetic field in a third plane, converted from one of the second plane and the first plane; and
   a second sensor within the single uniform space between the discontinuous ends and not extending within an interior portion of the wraparound geometric structure defined between the main section, the two sections and the opposing legs, and the second sensor senses the magnetic field in the third plane which is different from an original plane of the magnetic field such that the magnetic field is measured in three dimensions,
   wherein a distance which separates the main section and the opposing legs is such that a magnetic field traveling with the low permeability magnetic material does not travel or jump from the main section to any of the two sections or the opposing legs through a space defined by the distance.

15. The structure of claim 14, wherein the second sensor comprises a two-dimensional magnetic sensor.

16. The structure of claim 1, wherein the second plane or the third plane is the original plane.

17. The structure of claim 9, wherein the second plane or the third plane is the original plane.

18. The structure of claim 14, wherein the second plane or the third plane is the original plane.

* * * * *